United States Patent [19]

Ulmer, Jr.

[11] Patent Number: 4,894,608

[45] Date of Patent: * Jan. 16, 1990

[54] ELECTRIC CURRENT SENSOR USING THE FARADAY EFFECT

[75] Inventor: Edward A. Ulmer, Jr., Clearwater, Fla.

[73] Assignee: Square D Company, Palatine, Ill.

[ * ] Notice: The portion of the term of this patent subsequent to Jul. 5, 2005 has been disclaimed.

[21] Appl. No.: 76,456

[22] Filed: Jul. 22, 1987

[51] Int. Cl.$^4$ .................... G01R 31/00; G02F 1/31
[52] U.S. Cl. .................. 324/96; 324/158 R; 250/214 R
[58] Field of Search .............. 324/96, 224, 158 R; 350/376, 377, 378; 374/131; 356/43, 44; 250/227, 225, 231 R, 214 R

[56] References Cited

U.S. PATENT DOCUMENTS

| | | | |
|---|---|---|---|
| 4,348,587 | 9/1982 | Tangonan et al. | 250/227 |
| 4,498,348 | 2/1985 | Wesson | 73/862.05 |
| 4,540,937 | 9/1985 | Asars | 324/96 X |
| 4,563,639 | 1/1986 | Langeac | 324/96 X |
| 4,563,646 | 1/1986 | Desormiere | 324/244 |
| 4,564,754 | 1/1986 | Sata et al. | 250/225 |
| 4,598,996 | 7/1986 | Tanuchi | 374/131 X |
| 4,612,500 | 9/1986 | Chen et al. | 324/96 |
| 4,613,811 | 9/1986 | Vaerewyck et al. | 324/96 |
| 4,615,582 | 10/1986 | Lefevre et al. | 350/96.29 |
| 4,683,421 | 7/1987 | Miller et al. | 324/96 X |
| 4,698,497 | 10/1987 | Miller et al. | 324/96 X |
| 4,755,665 | 7/1988 | Ulmer, Jr. et al. | 324/96 |

FOREIGN PATENT DOCUMENTS

| | | |
|---|---|---|
| 0048304 | 4/1983 | Fed. Rep. of Germany . |
| 0048210 | 10/1982 | Japan . |
| 0048301 | 1/1983 | Japan . |
| 0177229 | 9/1985 | Japan . |
| 0048306 | 6/1983 | U.S.S.R. . |

OTHER PUBLICATIONS

Midwinter; "Optical Fibers for Transmission"; John Wiley & Sons; 1979; pp. V, 309 and 333.

EIA Standard RS-455-5; Electronic Industires Association; Sep. 1982; pp. 1, 19 and 20.
ANSI/EIA—RS-455-XX; American National Standards Inst.; pp. 3 and 4.
Rogers; "Method for Simultaneous Measurement of Current and Voltage on High Voltage Lines Using Optical Techniques"; PROC. IEEE, vol. 123, No. 10, Oct. 1976; pp. 957-960.
Chandler and Jahoda, Current Measurements by Faraday Rotation in Single—Mode OPtical Fibers, Rev. Sci. Instrum. 56(5), May, 1985, pp. 852-854.
Aben, Characteristic Directions in Optics of Twisted Birefringent Media, J. Opt. Soc. Am. A/vol. 3, No. 9, Sep. 1986, pp. 1414-1421.
Ulrich et al., Bending—Induced Birefrigence in Single—Mode Fibers, Optics Letters, vol. 5, No. 6, Jun. 1980, pp. 273-275.

(List continued on next page.)

Primary Examiner—Reinhard J. Eisenzopf
Assistant Examiner—Vinh P. Nguyen
Attorney, Agent, or Firm—A. Sidney Johnston; James E. Lowe, Jr.

[57] ABSTRACT

An electric current detector has a light source for generating light having substantially linear polarization and a predetermined polarization direction, a material substantially transparent to the light, the material having at least one characteristic direction, and the material exhibiting the Faraday effect in response to a magnetic field generated by the electric current. Also the light is launched into the material, and a predetermined angle established between the polarization direction and the characteristic direction, the predetermined angle chosen to permit separation of a rotation of the polarization of the light by the Faraday effect from polarization effects on the light by a birefringence of the material. A value of 22.5° for the magnitude of the predetermined angle permits a separation of the rotation of the polarization due to the Faraday effect from polarization effects due to a birefringence of the material.

29 Claims, 10 Drawing Sheets

OTHER PUBLICATIONS

Tabor and Chen, Electromagnetic Propagation through Materials Possessing Both Faraday Rotation and Birefringence: Experiments with Ytterbium Orthoferrite, Journal of Applied Physics, vol. 40, No. 7, Jun. 1969, pp. 2760-2765.

Day, et al., Design and Performance of Tuned Fiber Coil Isolators, Journal of Light Wave Technology, vol. LT-2, No. 1, Feb. 1984, pp. 56-60.

Malewski, Erickson, Measurement Applications, IEEE Tutorial Course, Fiber Optic Application in Electrical Power Systems, 1985.

Chandler, Forman, Jahoda, Klare, Fiber—Optic Heterodyne Phase—Shift Measurement of Plasma Current, Applied Optics, vol. 25, No. 11, Jun. 1986, pp. 1770-1774.

Kanoi, Takahashi, Sato, Higaki, Mori, Okumura, Optical Voltage and Current Measuring System for Electric Power Systems, IEEE Transactions on Power Delivery, vol. PWRD-1, No. 1, Jan. 1986, pp. 91-97.

Balteau Applies Fibre Optic Sensors to Instrument Transformers, Electrical Review International, Nov. 1986, p. 50.

Optics of Crystals, Chapter 14, "Optics of Crystals", from Principles of Optics, Third Edition, M. Born and E. Wolf, Pergamon Press, 1965.

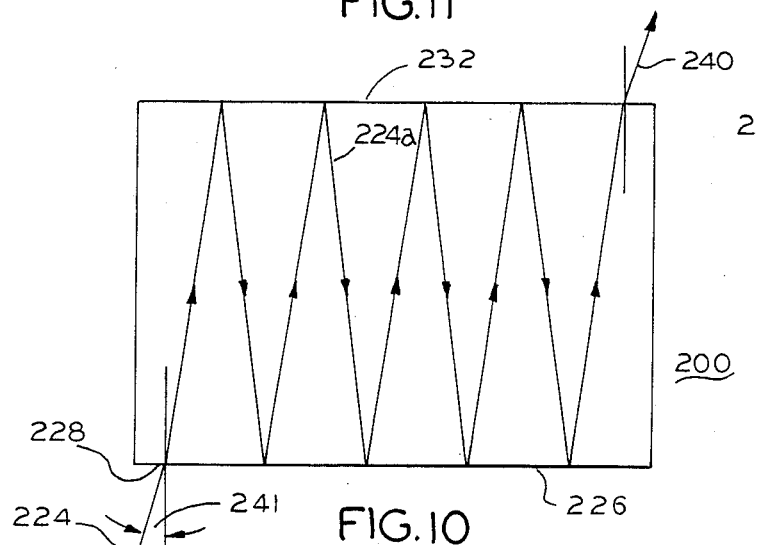
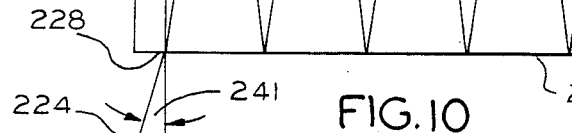
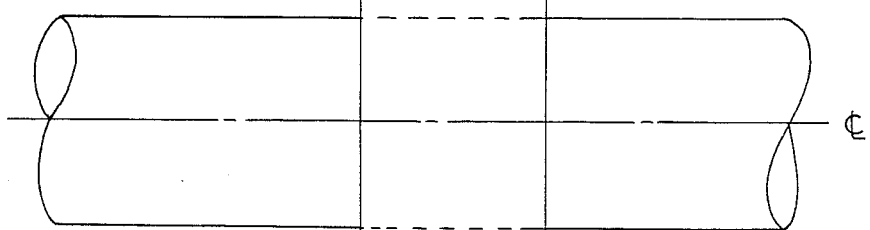

ELECTRIC CURRENT SENSOR USING THE FARADAY EFFECT

FIELD OF THE INVENTION

This invention relates to electric current sensors which utilize the Faraday effect, and more particularly to methods of separating Faraday rotation of polarized light from other factors causing unwanted distortion of polarized light such as stress birefringence.

BACKGROUND OF THE INVENTION

Many attempts have been made to construct a practical electric current sensor utilizing the Faraday effect. In a first class of such sensors, an optical fiber is formed into a coil of several turns, and the electric current flows in a conductor along the axis of the coil. The magnetic field produced by the current flow interacts with the optical fiber to rotate the direction of polarization of linearly polarized light launched into the fiber. Stress birefringence in the optical fiber also causes the state of polarization of the linearly polarized light propagating within the fiber to change. Light exiting from the fiber has its state of polarization changed both by the stress birefringence and by the Faraday effect. It is necessary to separate the polarization rotation produced by the Faraday effect from the unwanted changes in polarization state produced by other effects in order to measure the electric current flow. An additional complicating factor is that the stress birefringence of the fiber depends upon the temperature of the fiber. Thus, if the temperature of the fiber changes during time, then the stress birefringence will change. The variation of the stress birefringence with temperature adds an additional level of complexity to the attempt to separate the rotation of the polarization due to the Faraday effect and the distortions in the state of polarization due to other factors. The complexity is particularly troublesome when the disturbing effects due to stress birefringence change with time as the temperature of the fiber changes.

A second class of Faraday effect current sensors utilize solid blocks of transparent material, where the blocks of material are penetrated by a magnetic field produced by the current flow. Again, birefringence in the block of optical material introduces changes in the state of polarization of the light propagating in the solid transparent block and these changes must be separated from the rotation produced by the Faraday effect. In the event that the block material exhibits stress birefringence, the stress birefringence may be due to stresses produced in the glass when the glass was annealed, or may be induced in the glass by mechanical forces used to clamp the glass in position. Also, any stress birefringence in the glass is usually dependent upon the temperature of the glass. For example, if the glass is not at a uniform temperature, that is if one side of the glass is at a slightly different temperature from another side of the glass, this temperature gradient will set up stresses within the glass which may induce stress birefringence. So again, the separation of the rotation of the polarization direction induced by Faraday effect from changes in the state of polarization induced by other birefringent processes such as stress birefringence is an unsolved problem.

SUMMARY OF THE INVENTION

The invention separates the rotation (caused by the Faraday effect), of the polarization direction of linearly polarized light launched into an optical medium from those changes in the state of polarization caused by other effects in the medium such as stress birefringence. An electric current sensor has means for generating light having substantially linear polarization in a predetermined polarization direction. The substantially linearly polarized light is launched into a material transparent to the light, the material having at least one characteristic direction, and the material exhibiting the Faraday effect in response to the electric current. A predetermined angle is established between the polarization direction of the light and a characteristic direction of the transparent material. An angle of 22.5° has been found to be particularly useful in separating polarization rotation due to the Faraday effect from changes in the state of polarization due to stress birefringence. The invention has been implemented in both a fiber optic electric current sensor and a bulk glass electric current sensor.

Other and further aspects of the present invention will become apparent during the course of the following description and by reference to the accompanying drawings.

BRIEF DESCRIPTION OF THE FIGURES

Referring now to the drawings in which like numerals represent like parts in the several views:

FIG. 9 is a front side view of a bulk glass sensor.

FIG. 10 is a top view of a bulk glass sensor and a ray diagram showing the path of a light beam.

FIG. 11 is a rear side view of a bulk glass sensor.

FIG. 12 is a vector diagram taken at an exit point of a bulk glass sensor.

FIG. 13 is a side view of a magnetic concentrator and a bulk glass Faraday effect sensor.

DETAILED DESCRIPTION

An application for United States patent related to the present application, and filed on even date with the present application, is identified as Ser. No. 076524, and is issued as U.S. Pat. No. 4755665, on the date Jul. 5, 1988, all disclosures of which are incorporated herein by reference.

Figure 1:
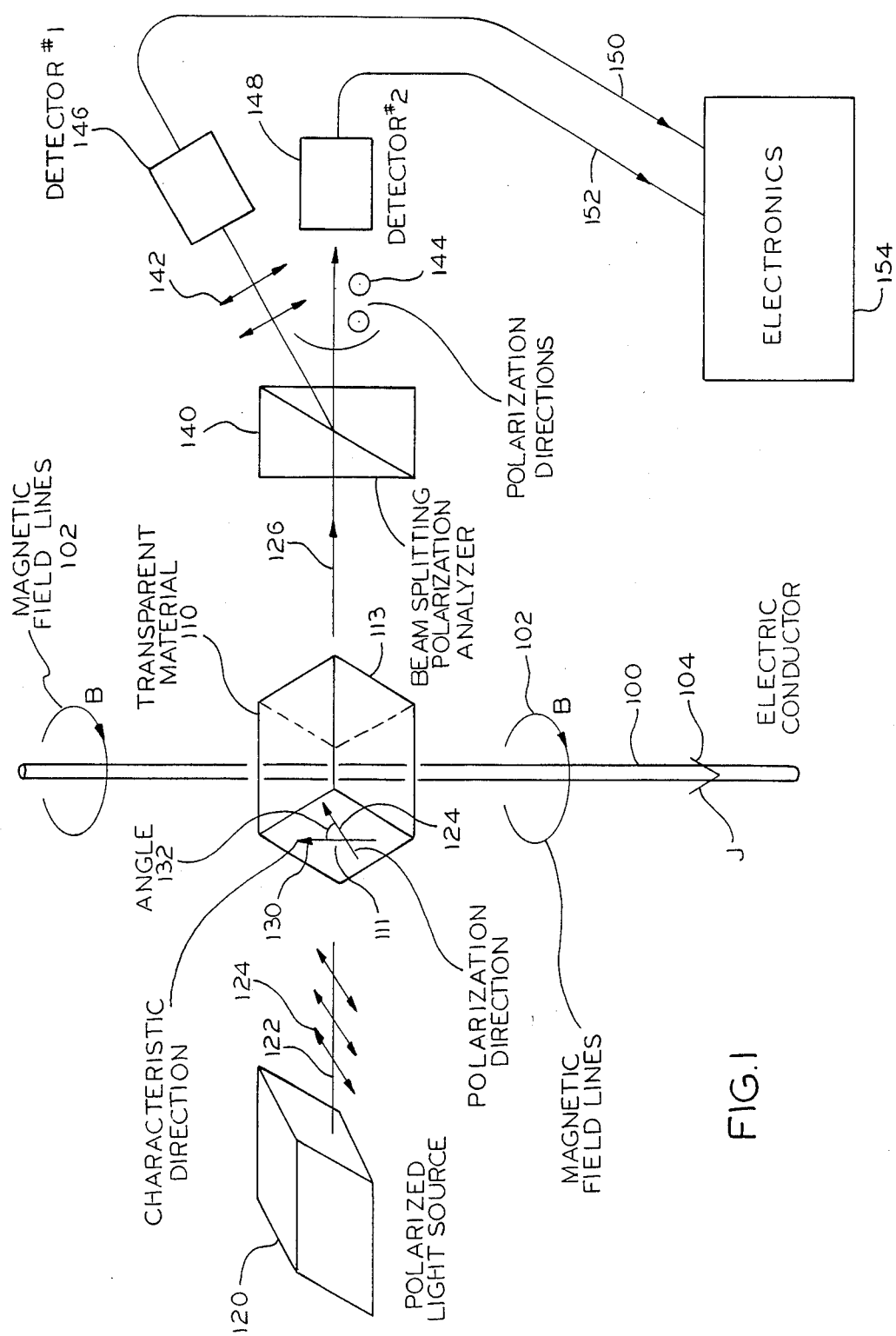
FIG. 1 is an idealized drawing of a Faraday effect electric current sensor.

FIG. 1 shows an electric current sensor utilizing the Faraday effect. An alternating electric current of RMS value J flows in conductor 100. Typical magnetic field lines 102 are produced by current J when flowing in the direction shown by arrow 104. The magnetic fields produced by the current J flowing in conductor 100 penetrate transparent material 110.

Polarized light source 120 produces a beam of light 122 having a linear polarization with the electric field vectors of light beam 122 oriented in a direction shown by arrows 124. Light beam 122 enters transparent material 110 at entrance face 111, and exits from the transparent material 110 at exit face 113 (shown with dotted lines) as light beam 126.

The Faraday effect is an induced circular birefringence of a transparent material, where the induced circular birefringence is caused by a magnetic field.

Linearly polarized light can be decomposed into two counter-rotating circularly polarized lightwaves of equal amplitude. In the absence of a magnetic field in an isotropic medium these left-hand and right-hand circularly polarized lightwaves travel at equal velocity. The two indicies of refraction $n_l$ and $n_r$ for the left-hand and right-hand lightwaves are equal. The magnetic field creates a difference between $n_l$ and $n_r$. One circular polarization travels faster than the other, and the net effect is a rotation of the linearly polarized light that is produced when the two circular lightwaves are recomposed.

The state of polarization of light beam 122 is changed by interaction with transparent material 110. The change in the state of polarization is caused by both the Faraday effect resulting from the magnetic field produced by the current J flowing in conductor 100, and other properties of the transparent material 110. Stress birefringence in transparent material 110 is particularly important in causing a change in the state of polarization of light beam 122 as it passes through transparent material 110.

Transparent material 110 has a characteristic direction indicated by arrow 130 at entrance face 111. The characteristic direction of the transparent material is defined in terms of the influence of the transparent material on linearly polarized light passing through the transparent material in the absence of a magnetic field. When linearly polarized light incident upon the transparent material has its direction of polarization aligned with a characteristic direction of the transparent material, then the light emerges from the transparent material linearly polarized. When the direction of polarization of the linearly polarized light makes an arbitrary angle with the characteristic direction of the transparent material, then the light emerges from the transparent material elliptically polarized.

The transparent material has a characteristic direction as a result of electrical anisotropy of the transparent material. The electrical anisotropy of the transparent material gives rise to principal dielectric axes of the transparent material, as disclosed more fully in the textbook by M. Born and E. Wolf, "Principles of Optics" Pergamon Press, Third Edition, 1964 and 1965, at chapter 14 "Optics of Crystals", beginning at page 665, et. seq., all disclosures of which text book are incorporated herein by reference.

The Born and Wolf textbook points out that in the general electrical anisotropic case a material will have three characteristic directions corresponding to the three principal axes of the dielectric tensor. The characteristic directions of optical materials has been further explored by H. K. Aben in an article entitled "Characteristic Directions in Optics of Twisted Birefringent Media", *Journal of the Optical Society of America A*/Vol. 3, No. 9, Sept. 1986, pages 1414–1421. Aben points out that even for inhomogeneous birefringent optical media there are always two perpendicular characteristic directions. Light entering the medium with its electric field vector aligned with either of these characteristic directions will emerge from the medium also linearly polarized. That is, Aben points out that the medium always possesses two mutually orthogonal characteristic directions. All disclosures of the Aben reference are incorporated herein by reference.

Operation of the Faraday effect electric current sensor will be discussed in terms of a selected characteristic direction.

Angle 132 is established between the polarization direction of linearly polarized light beam 122, as shown by arrows 124, and the selected characteristic direction, shown by arrow 130, of transparent material 110 at entrance face 111. Angle 132 is set to 22.5 degrees.

Emerging light beam 126 is in general elliptically polarized. The elliptical polarization of light beam 126 arises from the stress birefringence of transparent material 110.

Emerging light beam 126 is analyzed by polarization analyzer 140 into two orthogonal linearly polarized components. The two components are at +45° and −45° relative to the direction 124 of the electric field vector of the incident light, as that direction is modified by any twist of the characteristic direction 130 of the transparent material. The first component 142 has its direction of polarization 22.5°+45°=67.5° to the characteristic direction of transparent material 110 at exit face 113. The second component 144 has its direction of polarization 22.5°−45°=−22.5° to the characteristic direction of the transparent material 110 at exit face 113. The value of 22.5° matches the value of 22.5° chosen for angle 132.

Polarization analyzer 140 analyzes the polarization of emerging light beam 126 relative to the direction of the characteristic direction at the exit face 113 of transparent material 110. The orientation of the characteristic direction of the transparent material at the exit face 113 is not generally parallel to the characteristic direction as shown by arrow 130 at the entry face 111. The characteristic direction at the exit face 113 may differ from the entrance face characteristic direction in the situation wherein transparent material 110 is an optical fiber and the optical fiber is several meters long, has a core only a few microns in diameter, and is twisted along its longitudinal axis. Also a variation in the characteristic direction between the entry face and the exit face of transparent material 110 may occur in a solid block type of transparent material as a result of non-uniform stress birefringence resulting from either stress incorporated into the glass as the glass cools, or stresses applied to the glass by hardware applying clamping force to the glass, or for other reasons.

Photodetector 146 detects component 142 having a polarization direction at 67.5° to the characteristic direction of transparent material 110 at exit face 113. Photodetector 148 detects component 144 having polarization at −22.5° to the characteristic direction of transparent material 110 at exit face 113. Both detector 146 and detector 148 supply respective electrical signals 150 and 152 proportional to the intensity of the light reaching the respective detectors. The signals 150 and 152 are routed to electronics module 154.

Electronics module 154 performs algebraic operations on the strength of the signals 150 and 152 delivered by detector 146 and detector 148 in order to compute the strength of current J flowing in conductor 100.

Figure 2:
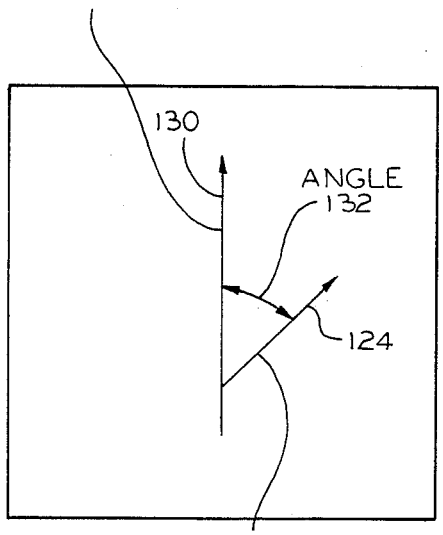
FIG. 2 is a vector diagram showing the relationship between a selected characteristic direction of a transparent material at the entrance face of the material and the direction of the electric field of a linearly polarized lightwave.

FIG. 2 shows the orientation of characteristic direction 130 at the entrance face of transparent material 110 and the direction of polarization, shown by arrow 124, of linearly polarized light beam 122 at the same entrance face 110. The present invention teaches that an optimum value for the magnitude of angle 132 is 22.5 degrees. The invention works equally well with angle 132 measured either clockwise or counterclockwise from the characteristic direction 130.

The combination of detector 146 and the signal processing electronics which operate on signal 150 produced by detector 146 constitute a "Channel." Similarly the combination of detector 148 and the electronics operating on signal 152 comprise another separate channel. We label one of these combinations as "Channel A" and the other combination as "Channel B." The precise definition of exactly which signal 150 and 152 corresponds to the Channel A signal (and similarly for Channel B) is described hereinbelow in the section titled "Theory".

The signals in both Channels A and B have an AC component and a DC component. The AC component arises from a modulation of the polarization direction of exit beam 126 by the Faraday effect caused by the AC electric current J flowing in conductor 100, and the DC component arises from the average intensity of the light striking the respective detector.

The signals A and B are used to compute the magnitude of current J flowing in conductor 100. A ten step computational algorithm is employed, as follows.

Step 1: Compute AC to DC Ratios.

The AC/DC ratios of the two signals 150 and 152 are computed. The magnitude of the AC to DC ratio for Channel A is designated A1. The AC to DC ratio for Channel B is designated B1. It is desirable that the AC to DC ratios should be computed to within 0.05% over a DC level range of 40:1 and a modulation depth variation of 0 to 0.87. The use of a low pass filter and a high pass filter along with an analog divider circuit has been found to be satisfactory. However, the signal processing could be done by use of A/D converters, with the AC and DC components separated with digital filtering algorithms.

The value of A1 is the signal that calibrates the apparatus to the magnitude of the current J.

Step 2: Determine Birefringence

The birefringence is determined as a function of the signals A1 and B1. The ratio R is then computed by:

First, an "average" value of both A1 and B1 is computed. The average value of A1 is designated AR. The average value of B1 is designated BR. The "average" value may be computed in any of several ways, for example: the "average" may be developed as a voltage by a peak detector which first halfwave rectifies the AC signal, that is A1 or B1, and then integrates the rectified signal; or the "average" may be computed as an RMS value; or the "average" may be computed by digitizing the signal and using a digital computer; or any other suitable means may be used to compute the average.

$R = AR/BR$

The total birefringence $\beta L$ is then computed as:

$\beta L = 2*\sin^{-1}(K1*(R-1)/(R+1))^{\frac{1}{2}}$

K1 is a stored constant that accounts for the non-zero extinction ratio of polarization filters. $\beta L$ has a typical range of values between 0 to 1.6 radians, and will more typically have a value near 0.5 $\beta$ is the birefringence per unit length and L is the total path length in the transparent medium.

Step 3: Basic Correction Factor

A1 must be divided by a correction factor that depends upon the birefringence $\beta L$. However, the correction factor also depends to a small extent upon the current J. The correction factor is computed using an iteration method since the current J is the unknown being measured.

A "basic correction factor" is computed as a function of birefringence $\beta L$ for a current J of 1.0 Ampere. The "basic correction factor" is designated CF(1, $\beta L$) where the "1" stands for 1.0 Ampere.

The "basic correction factor" CF(1, $\beta L$) is computed from the above value of $\beta L$ by using a look-up table. A table of values for CF(1, $\beta L$) is given in Table 1 as follows:

TABLE 1

| $\beta L$ (Radians) | | |
|---|---|---|
| 0 | CF(1, 0) = | 1.00000 |
| $\pi/10$ | CF(1, $\pi/10$) = | 1.00831 |
| $\pi/5$ | CF(1, $\pi/5$) = | 1.03425 |
| $3\pi/10$ | CF(1, $3\pi/10$) = | 1.08124 |
| $2\pi/5$ | CF(1, $2\pi/5$) = | 1.15630 |
| $\pi/2$ | CF(1, $\pi/2$) = | 1.27319 |

An explanation of how the values of Table 1 are calculated will be given hereinbelow in the section headed "Theory".

For the example given here, CF(1, $\beta L$) has a value that lies between 1 and 1.28. The higher number depends on the details of the sensor design. The upper limit of the correction factor is strongly related to the amount of Faraday rotation per unit length vs. the birefringence per unit length. It has been found satisfactory to interpolate the above table for CF(1, $\beta L$) as a function of $\beta L$ utilizing Lagrange interpolation employing a sixth order polynomial.

Step 4: Estimate The Part of A1 due to Faraday Effect.

The part of A1 due solely to Faraday effect is designated FA1. The estimated part of A1 due to Faraday effect is designated EFA1, (Estimated Faraday A1). Compute the estimated part of FA1 due to Faraday effect, EFA1 by:

$EFA1 = A1/CF(1, \beta L)$

This estimated EFA1 is a first estimate of the Faraday effect component of signal A1. EFA1 is only an estimate because it is necessary to adjust the correction factor to the measured value of current J. This adjustment is done by iteration. However, experience indicates that the adjustment to the correction factor is fairly small, and so the above computed value of EFA1 will be close to the final value adopted for FA1.

Step 5: Spread Function.

A new quantity, the Spread Function $SF(\beta L)$, is introduced as a function of the birefringence, $\beta L$, computed hereinabove at Step 2. Table 2 shows the Spread Function $SF(\beta L)$ as a function of the birefringence for 6 different values of the the birefringence as follows:

TABLE 2

| $\beta L$ (radians) | SF ($\beta L$) |
|---|---|
| 0 | 0 |
| $\pi/10$ | $1.2923\ 10^{-4}$ |
| $\pi/5$ | $5.4109\ 10^{-4}$ |
| $3\pi/10$ | $1.32302\ 10^{-3}$ |
| $2\pi/5$ | $2.66131\ 10^{-3}$ |
| $\pi/2$ | $4.94512\ 10^{-3}$ |

Lagrange interpolation has been found satisfactory to determine the spread function $SF(\beta L)$ from a six (6) value table such as Table 2. The calculation of the values of $SF(\beta L)$ is explained hereinbelow in the section titled "Theory".

Step 6: Calibration Table Of Current vs. FA1

A calibration table of the magnitude of current J flowing in conductor 100 and the value of the part of signal A1 due to Faraday effect is created using known values of the current. The procedure for generating this table is described below in the "Theory" section. The measured value of signal FA1 is designated FA1(k) where it takes on values (1, 2, . . . k) for k calibration measurements. From the calibration table, a first estimate of the current, JE, is determined from the above value of EFA1. An exemplary calibration table constructed using known values of the current appears in Table 3, as follows:

TABLE 3

| Current (Amperes RMS) | FA1 (Volts) |
|---|---|
| 0 | FA1(1) |
| 300 | FA1(2) |
| 600 | FA1(3) |
| 900 | FA1(4) |
| 1200 | FA1(5) |
| 1500 | FA1(6) |

The value of FA1 calculated above at step 4 is used to look up the estimated current, JE. Lagrange interpolation has been found satisfactory to determine the estimated current, JE, from a six (6) value table such as Table 3.

Step 7: Adjusted Correction Factor

The adjusted correction factor is computed from the estimated value of the current, JE, computed in step 6, and the "basic correction factor" $CF(1, \beta L)$ determined in Step 3. The adjusted correction factor is represented by $ACF(JE, \beta L)$.

The adjusted correction factor is computed as follows:

$$ACF(JE,\beta L) = CF(1, \beta L) - SF(\beta L)^*(J/J_{MAX})^2$$

In the above expression $J_{MAX}$ is the maximum nominal current that the system is designed to measure. Table 2 was computed for a $J_{MAX}$ of 1,500 amperes.

The value of JE computed at Step 6 is used for the current J to compute $ACF(JE,\beta L)$. The spread function is a measure of the difference between the correction factor at low currents (1 amp) and the correction factor at high currents ($J_{MAX}$). This variation, or "spread", of the correction factor is almost proportional to the square of the current J. It has been found satisfactory to model the correction factor as having a quadratic dependence on current J as shown above in the expression for $ACF(JE,\beta L)$.

Step 8: Next Estimate Of An Improved Value of The Signal FA1.

An improved estimate for the value of FA1 is designated EFA1(n) where the value of n labels the estimate. EFA1(n) is computed as follows:

$$EFA1(n) = A1/ACF(JE,\beta L)$$

Step 9: Comparing EFA1's

The computation for the magnitude of current J then continues to iterate through steps 6 to 9 until a new value is sufficiently near the last value of EFA1. EFA1(n) indicates the n'th value, or last value, computed for EFA1, and EFA1(n−1) indicates the next to last value computed for EFA1. The iteration continues until the following condition is met:

$$\left| \frac{EFA1(n) - EFA1(n-1)}{EFA1(n)} \right| < \epsilon.$$

A predetermined small value of $\epsilon$ is chosen. A value of 0.00005 has been found to be satisfactory for $\epsilon$.

The result of the above condition is that the two values of EFA1 are either "close enough" or "not close enough". If they are "not close enough", then it is necessary to return to step 6 and perform another iteration. Once the two EFA1 values satisfy the "$\epsilon$" condition, then the computation moves on to step 10.

Step 10: Determination of Electric Current

The final value of the signal FA1 due solely to Faraday effect is given as the final value of EFA1 in the iteration of Step 9. The calibration table (Table 3) of Step 6 is then used with this final EFA1 value to determine the magnitude of the current flow J in amperes in conductor 100.

Lagrange interpolation using sixth order polynomials has been found to be satisfactory in all table interpolations in the above calculations.

Figure 3:
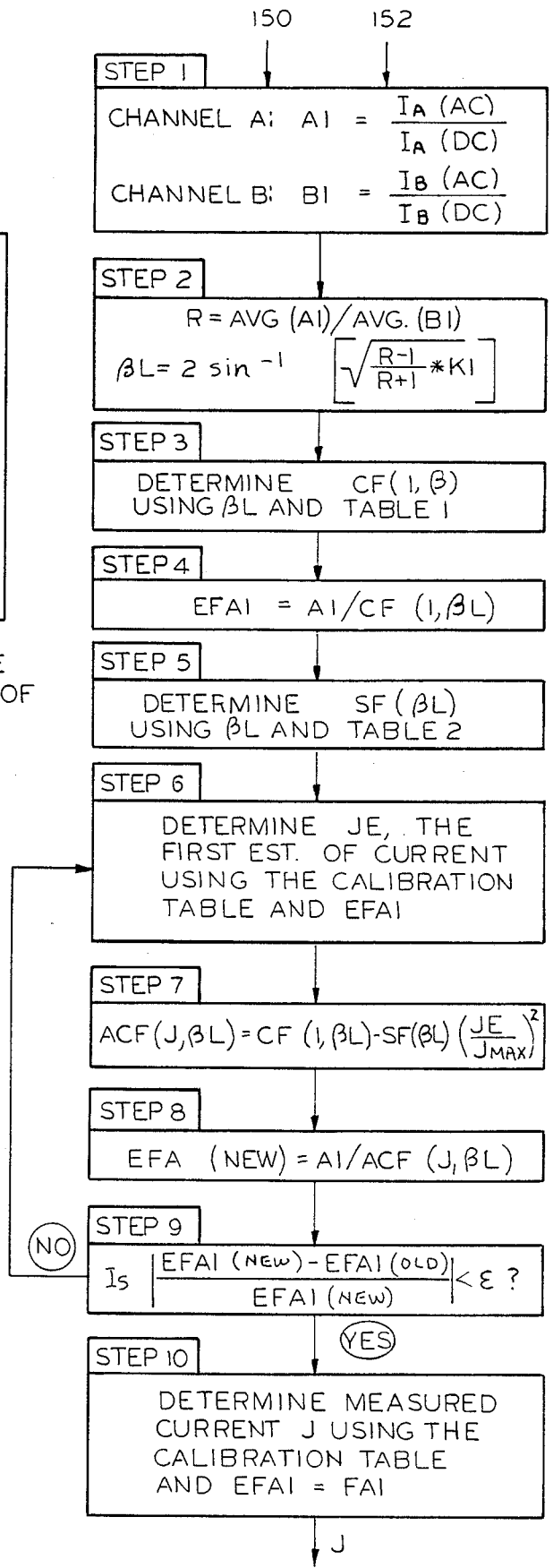
FIG. 3 is a flow chart of a computation sequence for a Faraday effect electric current sensor.

FIG. 3 gives a flow chart of the calculations as explained hereinabove.

Those skilled in the art will realize that the electronics 154 can also measure the phase of signal A1 relative to another signal such as the voltage waveform associated with the current flow in conductor 100. Such phase information is useful for measuring power flow in the conductor 100. Phase information could be developed, for example, by measuring the timing of the zero-crossing points in the AC waveform A1.

THEORY

The theoretical basis of the above mentioned ten step computational scheme is discussed in this theory section.

A description of an electromagnetic wave propagating through a medium exhibiting both the Faraday effect and linear birefringence has been developed by a number of authors. One such development is set out in the article "Electromagnetic Propagation Through Materials Possessing Both Faraday Rotation and Birefringence: Experiments With the Ytterbium Orthoferrite", W. J. Tabor and F. S. Chen, *Journal of Applied Physics*, Vol. 40, No. 7, Jun. 1969, pages 2760–2765. Another reference treating this problem is the article "Design and Performance of Tuned Fiber Coil Isolators", G. W. Day, et al., *Journal of Lightwave Technology*, Vol. LT-2, No. 1, Feb. 1984, pages 56–60. A third reference presenting developments in the propagation of light through dielectric materials is the text book *Optics*, E. Hecht and A. Zajac, Addison Wesley Publishing Co., Reading, MA Dec. 1976, pages 266–271.

All disclosures of the above cited Tabor and Chen reference, the G. W. Day, et al. reference, and the Hecht and Zajac reference are incorporated herein by reference.

The Faraday effect is a rotation of the direction of polarization of linearly polarized light as that light is transmitted through a transparent medium in the presence of a magnetic field. The direction of polarization is rotated in response to a component of the magnetic field that is parallel to the direction of transmission of the light. The strength of the Faraday effect in a given non-ferromagnetic medium is measured by the Verdet constant, V. The Verdet constant expresses a proportionality between the angular amount of rotation $\theta$ of the direction of polarization of the light, and the product of the magnetic field strength H, with the distance the light travels through the medium in the presence of the magnetic field. The relationship in mks units is given by:

$$\theta = \mu V \int \vec{H} \cdot \vec{dl} \qquad \text{EQ 1}$$

For electric current sensors of the type described herein the magnetic field H is produced by the electric current J.

The symbol $\mu$ represents the magnetic permeability of the medium.

Typical values of the Verdet constant for solids are so small that it has often proved desirable to increase the path length either by reflection or by using several turns of an optical fiber about a current carrier in order to achieve Faraday rotations of usable magnitude. For example, for silica (a commonly used material found in the core of optical fibers)

$\mu$ = approximately $\mu_0$, where $\mu_0$ is the permeability of free space and, $\mu V = 2.93 \; 10^{-6}$ radians/(amp turn) at a wavelength of 780 nm.

In a case where the optical path in the transparent medium forms N closed loops around the conductor, the angular amount of rotation $\theta$ is given by:

$$\theta = \mu V N J \qquad \text{EQ 2A}$$

N is the number of times the optical path encircles the conductor, and J is the current in the conductor.

The Verdet constant of the silica optical fiber depends strongly on the wavelength of the light. The reference "Dispersion of the Verdet Constant in Stress Birefringent Silica Fiber," J. Noda et. al., *Electronics Letters*, Vol. 20, p. 906–908, (1984) gives the Verdet constant in silica fibers as:

$$\mu V(\lambda) = 1.8 \lambda^{-2}$$

For coils of optical fiber the units are: $\lambda$ is in nm, and $\mu V(\lambda)$ has units of radians/(amp turn). Since semiconductor light sources are known to change wavelength with temperature, it is necessary to control the temperature of the light source to keep the wavelength constant, and thereby fix the value of the Verdet constant.

For solid blocks of transparent material formed from SF6 glass manufactured by Schott Glass Technologies, Inc., the Verdet constant in mks units at a wavelength of 820 nm is:

$$V = 10 \text{ radians/(tesla-meter)}.$$

The angular amount of rotation, $\theta$, within the solid block will depend on the specific mechanical design of the sensor, but can be generally expressed in functional form as $$\theta = f(\mu, V, L, J) \qquad \text{EQ 2B}$$

The Verdet constant of SF6 glass also exhibits a strong dependence on the wavelength of light. A Technical Information Note from Schott Optical Glass entitled: "Faraday Effect and Verdet Constant for Some Optical Glasses," May 11, 1976 gives data for SF6 glass which can be summarized by the relationship, $$V(\lambda) = (3.6 \; 10_7) \lambda^{-2.25}$$

Where $\lambda$ is in nm and $V(\lambda)$ in units of radians/(tesla meter). So as with the optical fiber material, the bulk glass material requires that the temperature of the semiconductor light source be held constant to fix the value of the Verdet constant.

Linear birefringence in the optical medium disturbs the measurement of the Faraday effect.

Linear birefringence arises from the fact that the optical medium has different indices of refraction along two different optical axes. The symbol $\beta$ is used to designate the linear birefringence per unit length of the path length in the medium.

F is the Faraday rotation per unit length (F = $\theta$/L), and L is the total path length through the medium. The quantity $\phi$ is used to designate a combination of Faraday rotation and linear birefringence and is defined as:

$$(\phi/2)^2 = (\beta/2)^2 + F^2 \qquad \text{EQ 3}$$

Using the above notation, the relationship between input and output polarization state is as follows:

$$\begin{bmatrix} E_{xo} \\ E_{yo} \end{bmatrix} = \begin{bmatrix} \cos(\phi L/2) - j\frac{\beta}{\phi}\sin(\phi L/2) & -\frac{2F}{\phi}\sin(\phi L/2) \\ \frac{2F}{\phi}\sin(\phi L/2) & \cos(\phi L/2) + j\frac{\beta}{\phi}\sin(\phi L/2) \end{bmatrix} \begin{bmatrix} E_{xi} \\ E_{yi} \end{bmatrix} \qquad \text{EQ 4}$$

The notation used in equation 4 is as follows:

E denotes components of the electric field of the lightwave, the subscripts i and o denote input states and output states respectively with respect to the transparent Faraday medium, and the subscripts x and y denote the components of the electric field amplitude E along two orthogonal directions in the system.

A Jones vector representing the light incident on the Faraday medium is given by:

$$\begin{bmatrix} E_{xi} \\ E_{yi} \end{bmatrix} = \begin{bmatrix} E_p \cos \alpha \\ E_p \sin \alpha \end{bmatrix} \qquad \text{EQ 5}$$

In the Jones vector $E_p$ is the amplitude of the electric field vector that has passed through the polarizer and $\alpha$ is the angle that the polarizer transmission axis makes with a characteristic direction in the Faraday medium.

The electric field amplitude $E_a$ through an analyzer whose transmission axis is oriented at an angle $\Psi$ from the previously referenced characteristic direction is given by the relation:

$$\begin{bmatrix} E_{ax} \\ E_{ay} \end{bmatrix} = \begin{bmatrix} E_{ax} \cos \psi \\ E_{oy} \sin \psi \end{bmatrix} \qquad \text{EQ 6}$$

Combining the above expressions, and obtaining the intensity by multiplying through by the complex conjugate, gives the following expression for the light intensity $I_o$ of the output of the analyzer, where $I_i$ is the intensity of the light incident on the Faraday medium.

General settings of the polarizer and analyzer are specified by the angles $\alpha$ and $\Psi$. The angles $\alpha$ and $\Psi$ are defined in planes orthogonal to the direction of propagation of the light beam.

$$I_o(\alpha,\psi) = I_i \Big[ \cos^2(\phi L/2) \cos^2(\psi - \alpha) + \frac{4F^2}{\phi^2} \sin^2(\phi L/2)\sin^2(\psi - \alpha) + \frac{F}{\phi} \sin(\phi L) \sin[2(\psi - \alpha)] + \frac{\beta^2}{\phi^2} \sin^2(\phi L/2) \cos^2(\psi + \alpha) \Big] \qquad \text{EQ 7}$$

According to the teachings of the present invention, it has been found desirable to set the angle that the polarizer transmission axis makes with a characteristic direction of the Faraday medium, the angle $\alpha$, to 22.5°. Analyzers are then placed so that they make angles $\Psi = \alpha \pm 45°$. When these values are used, equation 7 simplifies so that the effects of the Faraday rotation and the linear birefringence may be separated. The output light beam is directed into a beam splitter providing analyzer settings having the two above mentioned values of the angle $\Psi$, and expressions for the two intensities observed through this beam-splitting analyzer are as follows:

$$I_{oA} = \frac{I_i}{2} \Big[ 1 - (\beta/\phi)^2 \sin^2(\phi L/2) + \frac{2F}{\phi} \sin (\phi L) \Big] \qquad \text{EQ 8A}$$

$$I_{oB} = \frac{I_i}{2} \Big[ 1 + (\beta/\phi)^2 \sin^2(\phi L/2) - \frac{2F}{\phi} \sin (\phi L) \Big] \qquad \text{EQ 8B}$$

Light transmitted through each of the two analyzers is detected. The detector responding to the intensity from the analyzer set in accordance with equation 8A is designated "Channel A". The detector detecting intensity in accordance with the analyzer oriented in accordance with equation 8B is designated "Channel B".

The signals in Channel A and Channel B have both an AC component and a DC component. The AC component corresponds to the time varying Faraday rotation due to the AC magnetic field produced by current flowing in the conductor. The DC component corresponds to the constant light signals through each analyzer axis in the absence of a magnetic field.

The first step in analyzing the signals from Channel A and Channel B in order to determine the amount of Faraday rotation is to use a technique such as analog filtering or digital filtering in order to separate the AC component of the signals and the DC component of the signals. In Channel A, the AC component of the signal is divided by the DC component of the signal. In Channel B, the AC component of the signal is divided by the DC component of the signal. Two quantities, A1 and B1, are defined for Channel A and Channel B respectively as follows:

$$A1 = I_A(AC)/I_A(DC) \qquad \text{EQ 9}$$

$$B1 = I_B(AC)/I_B(DC) \qquad \text{EQ 10}$$

The ratio of the "average" value of A1, denoted by AR, to the "average" value of B1, denoted by BR, is designated R. Therefore R is given by:

$$R = AR/BR \qquad \text{EQ 11}$$

The average values of the AC components of signals A1 and B1 are equal. This equality is evident from the symmetry exhibited by equations 8A and 8B, remembering that the time-varying component produced by the AC current J appears in the specific Faraday rotation F and in $\phi$ through equation 3.

The ratio R reduces to the ratio $I_B(DC)/I_A(DC)$. The DC components given by equations 8A and 8B are obtained by simply setting the AC component F to zero. $\phi$ then equals $\beta$, and the ratio R may be written:

$$R = \frac{1 + \sin^2 (\beta L/2)}{1 - \sin^2 (\beta L/2)} \qquad \text{EQ 12}$$

Inverting the relationship for R gives an analytic expression for the total linear birefringence in the medium, $\beta L$, as a function of the measured ratio R:

$$\beta L = 2 \arcsin ((R-1)/(R+1))^{\frac{1}{2}} \qquad \text{EQ 13}$$

For zero birefringence AR=BR, and R=1. For non-zero birefringence, the calculated birefringence is a monotonically increasing function of R for values of R of interest in practical devices.

A more complete treatment of the theoretical problem includes the effects of imperfect polarizers whose extinction coefficients, $\rho_p$, are not zero. For such devices it can be shown that the (R−1)/(R+1) term in eq. (13) has an additional coefficient:

$$K1 = 1/(1 - 8\rho_p).$$

This K1 is shown in Step 2 hereinabove.

For an extinction ratio of 30,000 to 1, which is obtainable with commercially available thin film polarizers, $\rho_p$ is:

$\rho_p = 0.00003$ with this value of $\rho_p$, $K1 = 1.00024$

If birefringence were not present ($\beta = 0$) to disturb the measurement of the Faraday rotation, then equations 8A and 8B reduce to:

$$I_o(\beta = 0) = \frac{I_i}{2}[1 \pm \sin(2FL)] \qquad \text{EQ 14}$$

where the choice of sign ($\pm$) depends on whether the analyzer axis is at $+45°$ or $-45°$ with respect to the polarizer transmission axis. In either case, the AC/DC ratio is the same and $$A1(\beta L = 0) = B1(\beta L = 0) \qquad \text{EQ 15}$$
$$= \sin(2FL)$$

Figure 4:
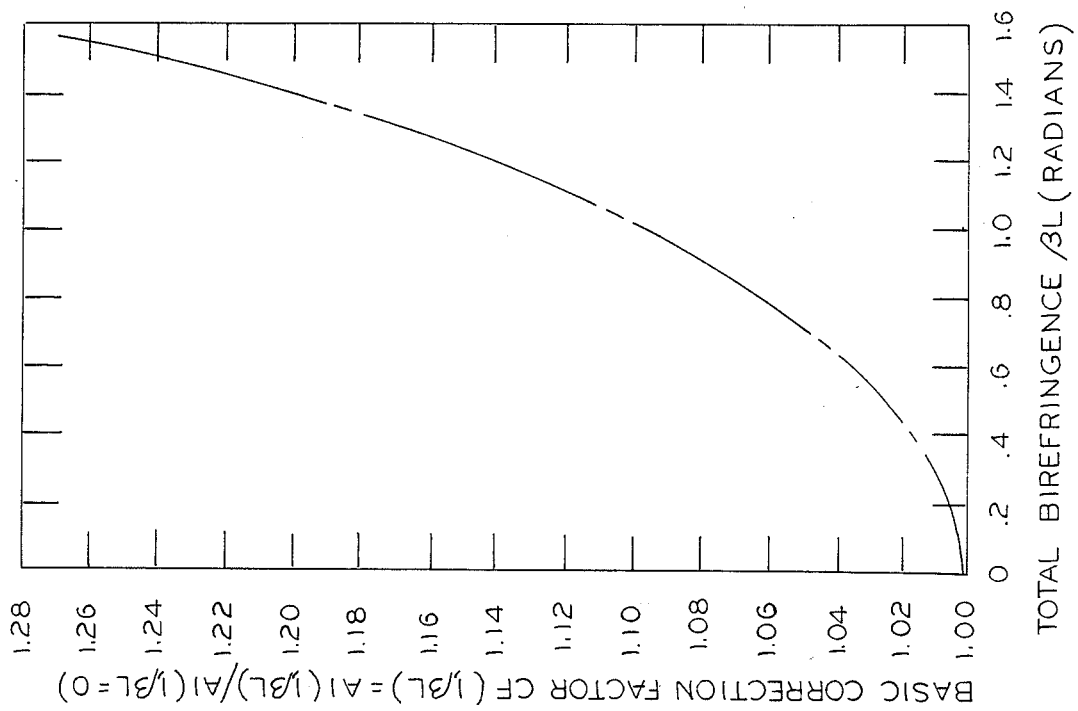
FIG. 4 is a graph showing a correction factor plotted versus total birefringence for a predetermined electric current.

When birefringence is present, it causes the value of $A1(\beta L)$ to increase monotonically with increasing birefringence. FIG. 4 plots the ratio of $A1(\beta L)/A1(\beta L=0)$ for values of birefringence between 0 and $\pi/2$ calculated using equations 2A or 2B, 3, 8A, 9 and 15. It is thus evident from the graph in FIG. 4 that for a given value of $\beta L$ there is a unique relationship between the signal $A1(\beta L)$ and that portion of the signal due solely to the Faraday effect $A1(\beta L=0)$. In the calculations of $A1(\beta L)$ and $A1(\beta=0)$ the DC component within equation 8A is obtained by simply setting $F=0$. $\phi$ then becomes equal to $\beta$. Next the RMS value of equation 8A is computed by a numerical integration of the equation over one complete AC cycle. It has been found sufficient to use twelve equally spaced points in the AC cycle. The AC component with equation 8A is obtained by subtracting the DC component from the RMS value of $I_A$. This procedure can be expressed by rewriting equation 9 as:

$$A1 = \frac{I(AC)}{I(DC)} = \frac{RMS(I_A) - I(DC)}{I(DC)}$$

FIG. 4 is plotted from calculated values for a current J of 1.0 ampere. Up to this point, the medium taught in this invention permits the birefringence to be determined from measured values of $I_{OA}$ and $I_{OB}$. Once the birefringence is known, the relationship in FIG. 4 is exploited and the measured value of $A1(J, \beta L)$ is divided by the ratio CF from FIG. 4 to yield a measured value of $A1(J, \beta L=0)$. The calculated ratio:

$$CF(\beta L) = A1(J,\beta L)/A1(J,\beta L=0) \qquad \text{EQ 16}$$

serves as a correction factor $CF(\beta L)$. This procedure is used with $J=1.0$ ampere to produce the values of $CF(1, \beta L)$ in Table 1 hereinabove. In summary, the measured Faraday effect is determined by dividing the measured signal A1 by a calculated correction factor:

$$A1(J,\beta L=0) = A1(J,\beta L)/CF(\beta L) \qquad \text{EQ 17A}$$

Figure 5:
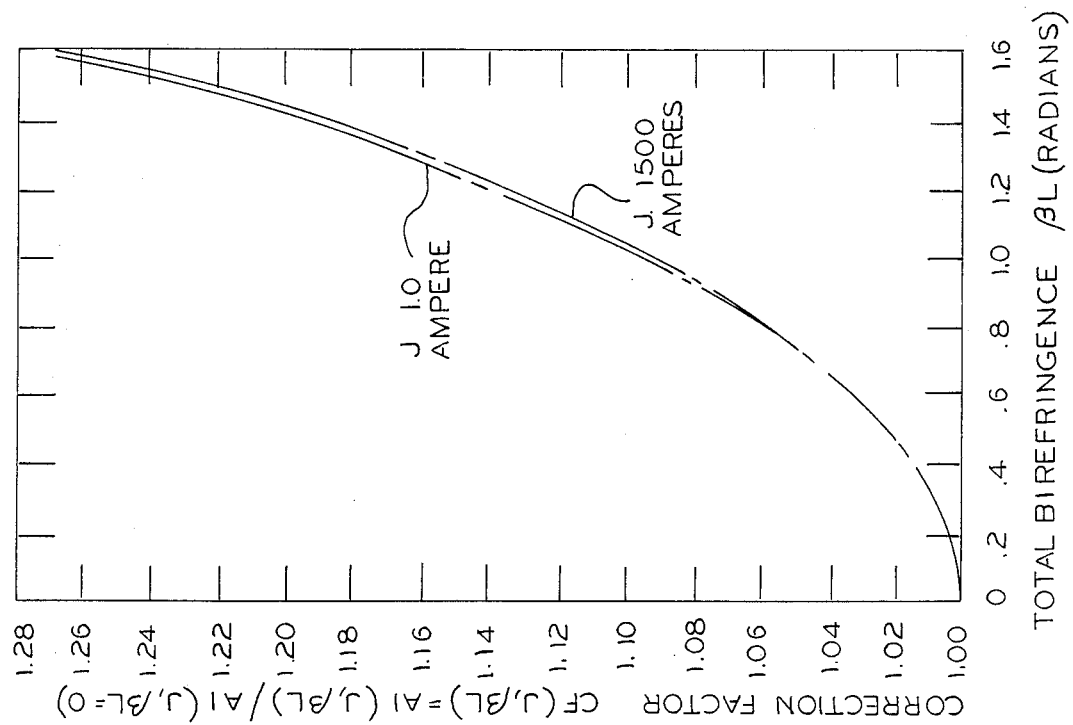
FIG. 5 is a graph showing a correction factor plotted versus total birefringence for 1 amp and 1,500 amps.

However, a more accurate correction factor is somewhat more complicated because the correction factor has a slight dependence on the current J. FIG. 5 shows values of the calculated correction factors for two values of current: $J=1.0$ amperes and $J=1,500.0$ amperes.

Figure 6:
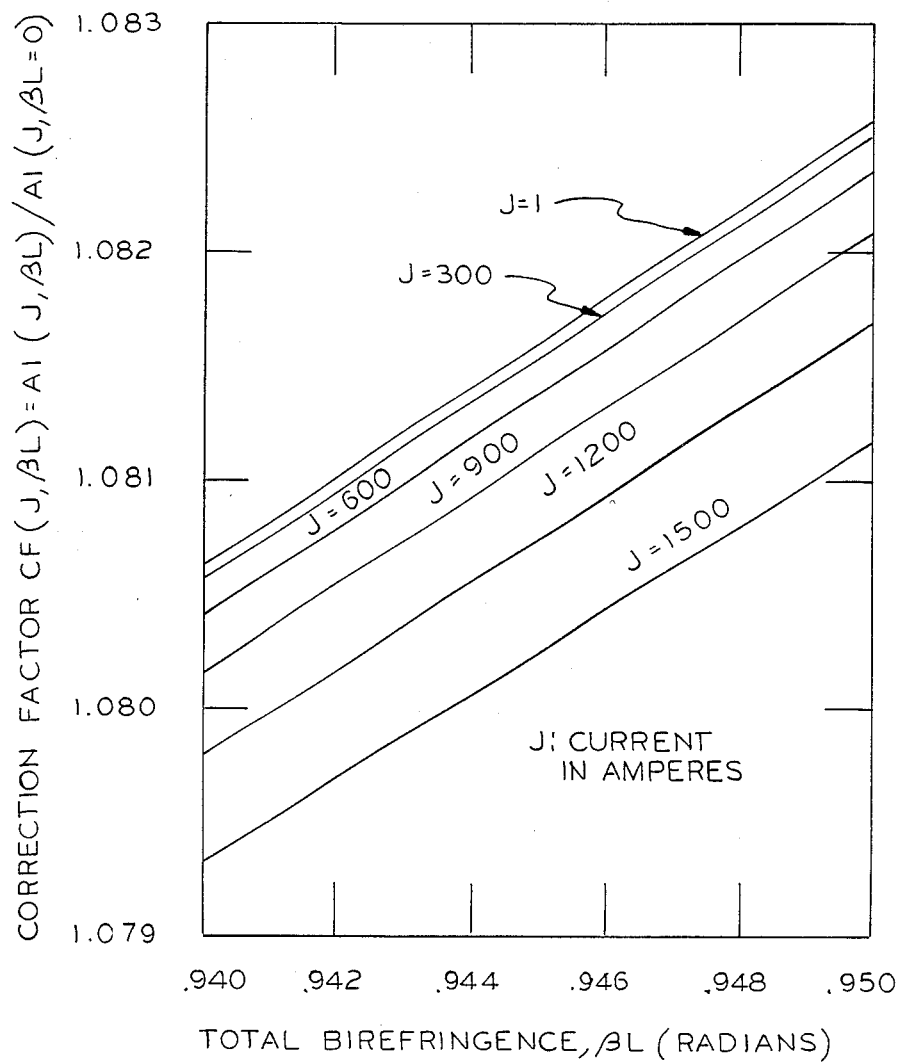
FIG. 6 is an expanded scale graph showing a correction factor plotted versus total birefringence for several values of electric current.

FIG. 6 shows, on an expanded scale, the value of the correction factor computed as a function of total birefringence, and also for electric current flows of 1.0 ampere, 300 amperes, 600 amperes, and 1,500 amperes. It has been found satisfactory to model the dependence of the correction factor CF as a quadratic function of current. The dependence of this adjusted correction factor upon current and birefringence is designated by the symbol $ACF(J,\beta L)$. The adjusted correction factor was computed for values of $\beta L$ in radians for a current flow of 1.0 ampere and for a current flow of 1,500.0 amperes. The coefficients used for the quadratic term are designated "Spread Function". The Spread Function is shown in Table 3 under the column marked (Spread Function) SF. Using the value of SF from Table 3, the adjusted correction factor at any current is then given by the following equation:

$$ACF(J, \beta L) = CF(1, \beta L) - SF(\beta L) \times (J/1500)^2 \qquad \text{EQ 17B}$$

Equation 17B has been found to give a satisfactory representation of the correction factor $ACF(J,\beta L)$ for current ranges below 1,500 amperes.

Also the iterative method of calibrating the electric current sensor discussed hereinabove in steps 1—10 has been found to satisfactorily account for the electric current J dependence of the correction factor.

Just as the basic correction factor $CF(1,\beta L)$ was calculated using equations 2A or 2B, 3, 8A, 9 and 15 with $J=1.0$ ampere, the spread function SF is calculated using numerical integration from:

$$SF(\beta L) = CF(1,\beta L) - CF(J_{MAX},\beta L) \qquad \text{EQ 18}$$

with $CF(J_{MAX}, \beta L)$ calculated using again equations 2A or 2B, 3, 8A, 9, 15 and 16 for a maximum current $J_{MAX}$ of 1,500 amperes. This is the procedure used to calculate the values of $SF(\beta L)$ in Table 2 hereinabove.

Calibration Procedure

This section explains how the current sensor is calibrated to produce the calibration table of the type illustrated in Table 3. In Table 3 specific values for the electric current in the conductor are associated with specific values of the Faraday effect signal FA1 for a predetermined number of measured current values (such as the six entries in Table 3).

The known currents J are measured by a previously calibrated "standard" instrument. Such an instrument typically has its accuracy certified by and traceable to a national standards laboratory such as the National Bureau of Standards in the U.S. Department of Commerce.

While the desired current J is measured with the standard instrument, the electric current sensor described in this invention simultaneously detects and records signals 150 and 152.

Signals 150 and 152 are processed by following steps 1, 2, 5, 7 and 8 as given in FIG. 3 and described hereinabove without any iteration and with EFA1 in step 8 now equal to FA1. After A1, B1, $\beta L$, and $SF(\beta L)$ are determined in steps 1, 2 and 5, the adjusted correction factor is calculated immediately in step 7 because the current is known. Step 8 then divides A1 by the adjusted correction factor to produce the value FA1 to be stored in Table 3 and associated with a particular current J.

The amount of stress birefringence is strongly dependent on the temperature of the transparent material. Changes in the stress birefringence are associated with changes in the temperature of the transparent material. The value of the total birefringence may therefore be used to give a good estimate of the temperature of the transparent material. The total birefringence is computed in Step 2 of the algorithm and is shown in FIG. 3. Since the transparent material is in close proximity to the power line, the temperature of the material is indicative of the temperature of the conductor of the power line. The signal processing electronics 154 can provide a good estimate of the temperature of the transparent material and therefore of the power line conductor. This temperature sensing function necessitates a separate calibration of birefringence versus temperature.

EXAMPLE 1: BULK GLASS FARADAY EFFECT ELECTRIC CURRENT SENSOR

Figure 7:
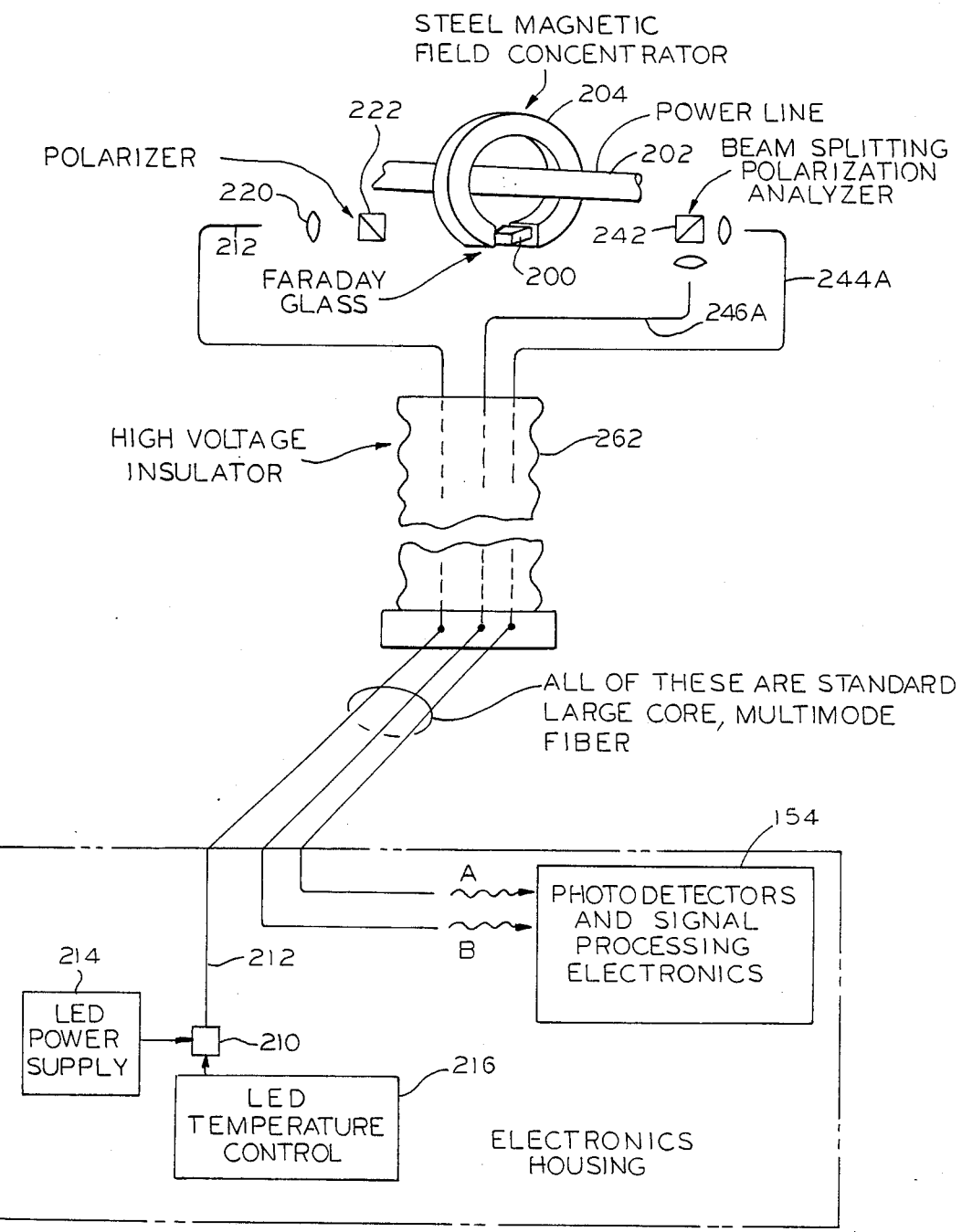
FIG. 7 is a Faraday effect electric current sensor using a bulk glass sensor and a magnetic concentrator.

FIG. 7 shows a bulk glass Faraday effect magnetic field sensor. Bulk glass sensor 200 is the sensitive element. An AC electric current flows in power line 202. A magnetic concentrator 204 concentrates the magnetic field produced by the current flowing in the power line 202 in order to increase the field strength of the magnetic field applied to bulk glass sensor 200. A light emitting diode (LED) 210 launches a light beam into optical fiber 212. Optical fiber 212 may be a standard large core, multi-mode optical fiber of standard design. Power supply 214 supplies current to LED 210. A temperature sensor and temperature control 216 controls the temperature of LED 210 in order to stabilize the wavelength of the output of LED 210. This wavelength stability is necessary to fix the value of the Verdet constant, as discussed hereinabove.

The light beam launched into optical fiber 212 by LED 210 is conducted by optical fiber 212 to lens 220 and polarizer 222. Polarizer 222 permits passage of only linearly polarized light.

Figure 8:
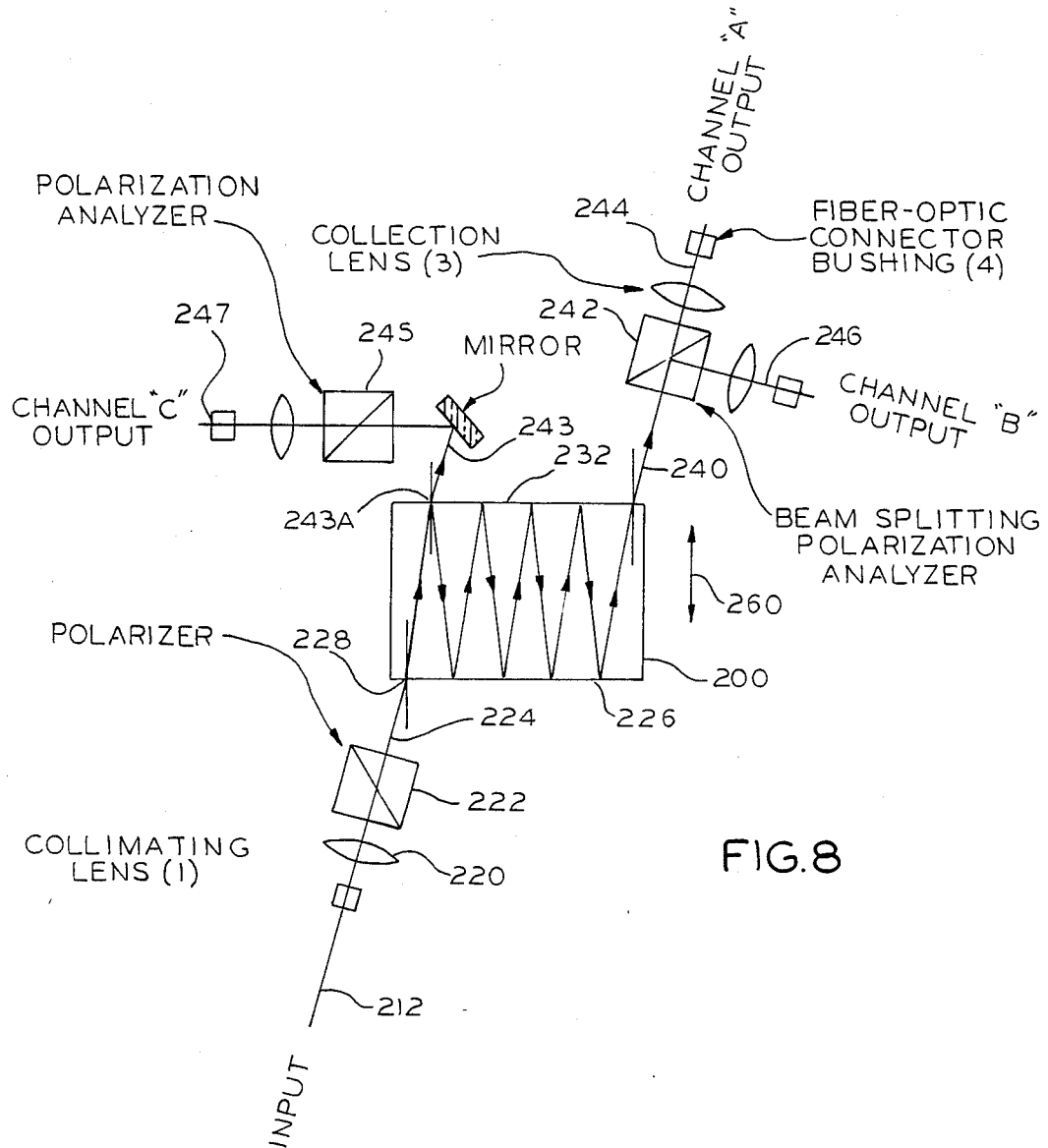
FIG. 8 is an optical ray diagram of a bulk glass Faraday effect electric current sensor.

FIG. 8 is a ray diagram showing passage of a light beam through bulk glass Faraday sensor 200. Linearly polarized light beam 224 emerges from polarizer 222. The direction of polarization of the electric vector of light wave 224 is determined by polarizer 222. The direction of a characteristic direction of bulk glass Faraday sensor 200 is determined. The angle between the direction of polarization of light beam 224 and the direction of the characteristic direction of bulk glass Faraday sensor 200 is set to a predetermined value. It has been found desireable and useful to set the magnitude of this angle to a value of 22.5 degrees.

FIG. 9 is a side view of face 226 of bulk glass Faraday sensor 200. The entry point of light beam 224 into bulk glass Faraday sensor 200 is indicated by cross 228. Arrow 130, as shown in FIG. 9, shows the direction of a characteristic direction of bulk glass Faraday sensor 200. Arrow 130 corresponds with the arrow of the same number shown in FIG. 2. Arrow 124 gives the direction of the electric field vector of light beam 224. Angle 132 between the characteristic direction shown by arrow 130 of bulk glass Faraday sensor 200, and the direction shown by arrow 124 of the electric field vector of light beam 224 is set to a predetermined value. It has been found to be desirable and useful to set angle 132 to a value of 22.5 degrees. FIG. 9 is drawn with the direction of the characteristic direction, shown by arrow 130, parallel to a short side 230 of bulk glass Faraday sensor 200. In the event that the characteristic direction of the bulk glass Faraday sensor is not parallel to a side of the bulk glass material, then still the angle 132 between the characteristic direction and the electric field vector of incident light beam 224 is set to a predetermined value, and 22.5 degrees has been found to be a useful value of that angle.

Light beam 224 enters bulk glass Faraday sensor 200 at point 228, where the light beam is refracted, and then undergoes multiple reflections at surface 226 and surface 232. The light beam finally emerges from bulk glass Faraday sensor 200 as output light beam 240.

FIG. 10 is a top view of bulk glass Faraday sensor 200 and shows the path of a ray 224A through the glass. Incidence angle 241 is measured between incident light beam 224 and line 241A drawn perpendicular to the plane of face 226. Incidence angle 241 is chosen to establish the desired number of reflections within bulk glass sensor 200.

FIG. 11 is a side view of face 232 of bulk glass Faraday sensor 200. Cross 241 indicates the emergent point for the light beam 240 as it exits bulk glass Faraday sensor 200.

As shown in FIG. 8, output light beam 240 has its polarization state analyzed by polarization analyzer 242. Light beam 244 has a linear polarization determined by polarization analyzer 242, and is then coupled into a multi-mode optical fiber 244A, as shown in FIG. 7. The intensity of light beam 244, as transmitted by optical fiber 244A to a photodector (not shown) mounted in electronics package 154, provides Channel A.

Light beam 246 has a polarization perpendicular to the polarization of light beam 244 as a result of interaction with polarization analyzer 242. Light beam 246 is coupled into optical fiber 246A, as shown in FIG. 7. Light beam 246 is coupled to a photodector through optical fiber 246A, where the photodector is mounted in electronics package 154. The intensity of light beam 246, as transmitted by optical fiber 246A provides Channel B.

Light beam 243 is shown emerging from face 232 of bulk glass sensor 200 through a partially silvered mirror at point 243A. Point 243A is also shown in FIG. 11. The polarization of light beam 243 is analyzed by polarization analyzer 245. An optical fiber 247 is coupled so that light beam 243 is launched into fiber 247. Fiber 247 provides a Channel C output. Channel C provides a high current detection capability for power line 202. For example, Channel C may be used to activate protective relaying in the event of a high current surge on power line 202. Thus, Channel C could provide short circuit protection for the power line.

FIG. 12 is a diagram showing possible directions of a characteristic direction of bulk glass Faraday sensor 200 and the polarization directions of light beams 244 and 246. Arrow 250 indicates the characteristic direction of bulk glass Faraday sensor 200 at point 241, as that characteristic direction is traced through the bulk glass from its direction 130 at the entrance face at point 228. The direction of the characteristic direction shown by arrow 250 may be parallel to the direction of the characteristic direction shown by arrow 130; or, if there is a twist in the characteristic direction of the bulk glass forming bulk glass Faraday sensor 200, then the characteristic direction shown by arrow 250 at the exit face of the glass will, in general, not be parallel to the direction of the characteristic direction at the entrance face shown by arrow 130. Still referring to FIG. 12, arrow 252 indicates a direction at an angle of 22.5 degrees to the characteristic direction shown by arrow 250. Polarization analyzer 242 is adjusted to provide output beams 244 and 246, so that one of the beams has polarization +45 degrees relative to the direction of arrow 252, and the other has polarization direction of −45 degrees to the direction of arrow 252. Therefore, one of the light beams will have polarization direction of 67.5 degrees, as shown by arrow 254, to characteristic direction shown by arrow 250; while the other light beam will have a polarization direction 256 at an angle of −22.5 degrees relative to the characteristic direction 250.

In some instances, the light beam having polarization direction 254, at an angle of 67.5 degrees relative to the characteristic direction 250, will be the light beam for Channel A; while in other situations the light beam having polarization direction 254 will be the light beam for Channel B. The light beam having polarization direction 256 of 22.5 degrees to the characteristic direction 250 will then be the light beam for the other channel.

Further, a number of factors determine whether the light beam for Channel A will have polarization direction of 67.5 degrees relative to the characteristic direction of the material at the exit point, or will have an angle of 22.5 degrees, or whether the light beam for Channel A will have a clockwise or a counter-clockwise rotation relative to the characteristic direction of the material at the exit point. Factors determining which light beam is the Channel A light beam include whether the characteristic direction selected at the entrance face, and indicated by arrow 130 in FIG. 9, is the "slow" characteristic direction or is the "fast" characteristic direction; also angle 132 of 22.5 degrees chosen between the characteristic direction 130 and the electric field direction 124 of incident light beam 224 can be in the clockwise direction, as shown in FIG. 9, or can be in the counter-clockwise direction, and this choice affects which light beam is Channel A.

Which light beam forms Channel A can be determined by reference to equation 9 and equation 10. Channel A is formed by that light beam which produces the larger signal after division of the AC component by the DC component. That Channel A is the larger signal can be seen by inspection of the denominator of equation 9 and the denominator of equation 10. The denominator of equation 9 is (1−a positive quantity), that is $1-\sin^2(\beta L/2)$, and the denominator in equation 10 is the same except there is a "plus" sign rather than a "minus" sign. The numerators in equation 9 and equation 10 each have a time dependence which is approximately the same. Thus, the smaller denominator in equation 9 causes the A Channel signal to be the larger signal. Whatever the choice of factors mentioned above: whether the chosen characteristic direction is the "slow" or the "fast" axis, whether the incident angle of the electric field polarization is clockwise or counterclockwise relative to the characteristic direction, etc., it will turn out that the intensity of the quotient of the AC component divided by the DC component of light beam 244 or light beam 246 will be described by equation 9, and the other beam will be described by equation 10. The signal having the larger quotient of AC component divided by DC component will be the signal for Channel A.

Figure 14:
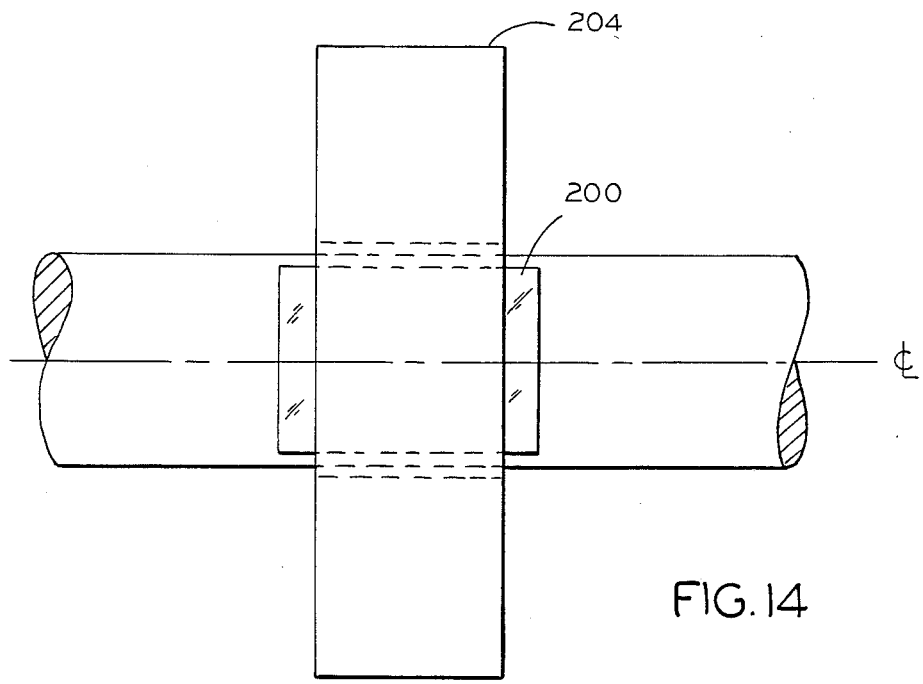
FIG. 14 is a top view of a magnetic concentrator and a bulk glass Faraday effect sensor.
Figure 15:
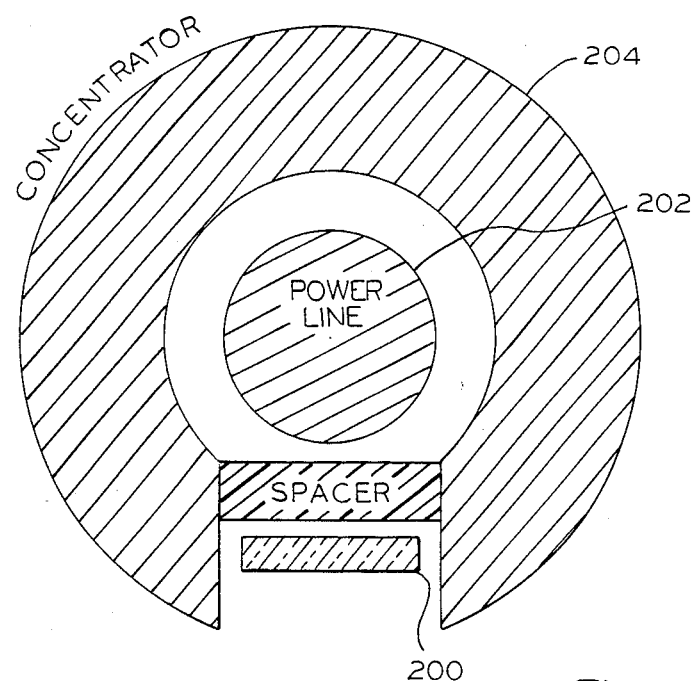
FIG. 15 is an end view of a magnetic concentrator and a bulk glass Faraday effect sensor.

FIG. 13, FIG. 14, and FIG. 15 show side, top, and end views of the concentrator 204, and the bulk glass Faraday sensor 200. The concentrator and the glass are mounted so as to surround power line 202. Entrance point 228 for light beam 224 (not shown in FIG. 13) is shown in FIG. 13. Light beam 224 comes from above the plane of the paper and enters bulk glass Faraday sensor 200 at entrance point 228. The magnetic field applied to bulk glass Faraday sensor 200 is applied in a direction shown by arrow 260 in FIG. 8.

As shown in FIG. 7, powerline 202 may be at a high voltage, for example at 100 KV or higher. Accordingly, the apparatus mounted around the power line, including the concentrator 204, the bulk glass Faraday sensor 200, lens 220, polarizer 222, and the beam splitting polarizer 242 must all be at the high potential of power line 202. Glass fibers 212, 244A, and 246A therefore have one end at high potential and another end near ground potential where they plug into electronics package 154. The fibers pass through high voltage insulator 262. The voltage between ground and the potential of power line 202 is across high voltage insulator 262.

EXAMPLE 2: OPTICAL FIBER FARADAY ELECTRIC CURRENT SENSOR

Figure 16:
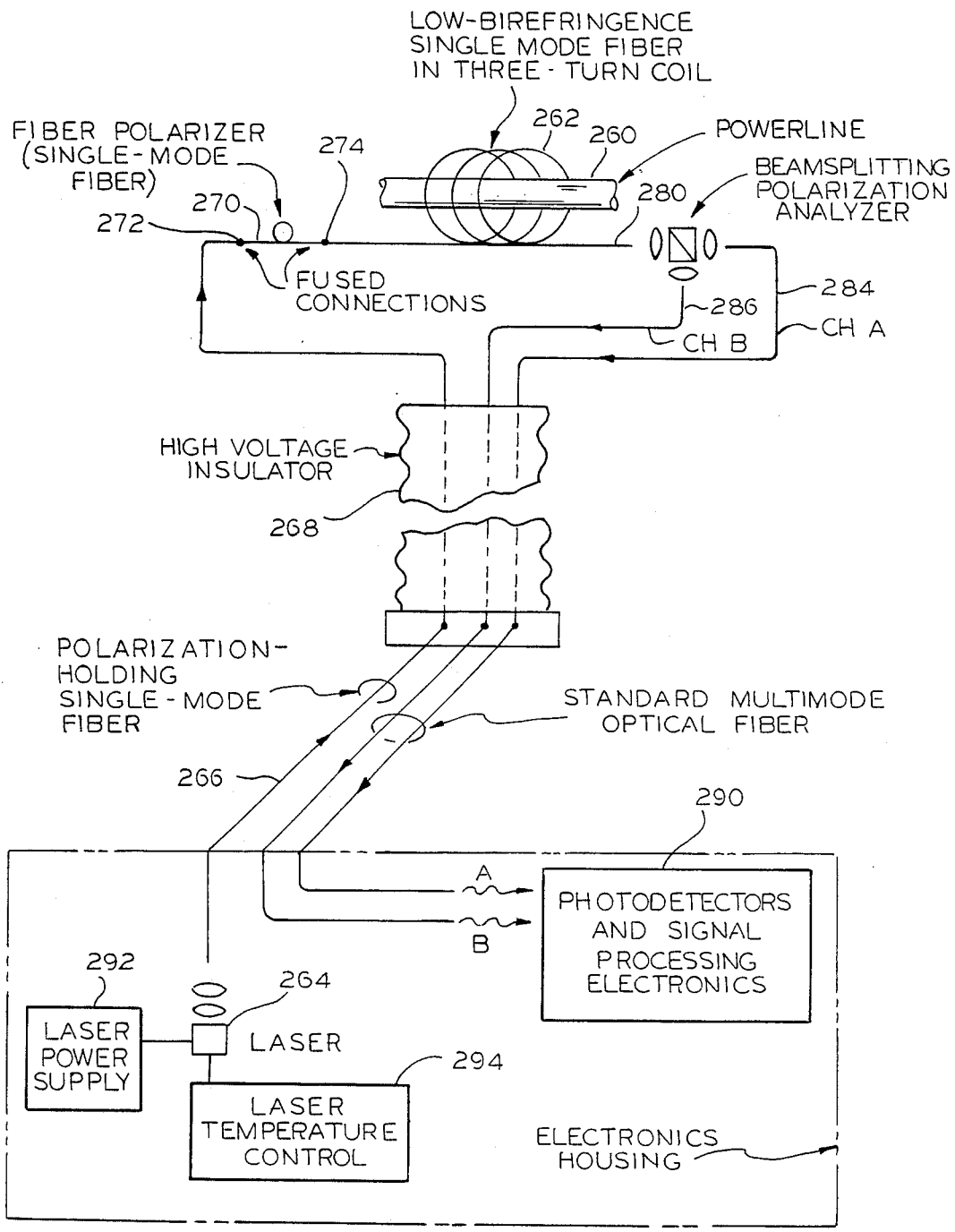
FIG. 16 is a Faraday effect electric current sensor using an optical fiber current sensor.

FIG. 16 shows an electric current sensor using the Faraday effect produced in an optical fiber in order to sense the electric current. A power line 260 carries an alternating electric current. A fiber loop sensing element 262 surrounds power line 260. Laser 264 is a solid state laser which serves as a light source for linearly polarized light. Linearly polarized light is launched by laser 264 into optical fiber 266. Optical fiber 266 is a polarization holding, single-mode optical fiber. Optical fiber 266 passes through high voltage insulator 268 and couples into polarizer 270. Polarizer 270 is an optical fiber polarizer having a high extinction ratio. Fused connection 272 is oriented so that the direction of polarization of linearly polarized light exiting from fiber 266 is coupled into the transmission direction of fiber polarizer 270.

Optical fiber polarizer 270 has fused connection 274 with fiber loop sensing element 262. Fiber loop sensing element 262 has a characteristic direction lying in the plane of the loops. Before fused connection 274 is made, the direction of polarization of the light exiting fiber polarizer 270 is set at a predetermined angle to the characteristic direction of fiber loop sense element 262. This predetermined angle is set at 22.5 degrees. FIG. 2 shows a typical characteristic direction of a transparent material 130 and a direction 124 of the electric field of linearly polarized light entering the transparent material. In the optical fiber Faraday electric current sensor, characteristic direction 130 may, for example, be a direction parallel to the plane of the loops of fiber loop sensing element 262. Direction 124 of the electric field of the polarized light launched into fiber loop sensing element 262 is the direction of the electric field of the light transmitted through fiber polarizer 270. Fused connection 274 must be made with an orientation such that angle 132, as shown in FIG. 2, is set at the desired predetermined value of 22.5 degrees.

Fiber loop sensing element 262 is a low birefringence single mode optical fiber. It has been found convenient to use a three turn coil for fiber loop sensing element 262, with a radius of approximately 10 centimeters for the loops.

Light emerging from fiber loop sensing element 262 through end 280 of the fiber is launched into polarizing beam splitter 282. Polarizing beam splitter 282 analyzes the polarization of the light exiting end 280 of fiber loop sensing element 262.

Light emitted from end 280 of fiber loop sensing element 262 is, in general, elliptically polarized. Also, a characteristic direction of fiber loop sensing element 262 is established at end 280, here the characteristic direction at end 280 takes into account any small axial twists occasioned in the fiber composing fiber loop sensing element 262. Fiber 284 and fiber 286 pick up, respectively, light lineraly polarized at +67.5 degrees or −22.5 degrees relative to the characteristic direction of fiber loop sensing element as it appears at end 280.

Optical fiber 284 picks up the light beam referred to as Channel A in the analysis hereinabove. Optical fiber 286 picks up the light beam referred to as Channel B hereinabove. The method of selecting which outgoing light beam is Channel A is the same as the method used in the bulk glass optical sensor, that is the larger of the signals obtained by dividing the AC component of the optical signal by the DC component of the optical signal is the signal for Channel A.

Optical fiber 284 and optical fiber 286 may be standard multi-mode optical fibers. Fiber 284 conducts the light comprising Channel A to photodector and signal processing electronics 290. Optical fiber 286 conducts the light comprising Channel B to photodector and signal processing electronics 290.

Analysis of the signals in Channel A and Channel B in order to calibrate the apparatus is done as described hereinabove with regard to the disclosures of FIG. 1, and with regard to the disclosures of the bulk glass sensor.

Laser 264 is used as a light source for the optical fiber Faraday electric current sensor in order to provide sufficient intensity for the apparatus. Typically, a laser operating at approximately 780 nanometers, and of the type utilized in commercial sound recording equipment, has been found suitable as laser 264. The laser is powered by power supply 292. Laser temperature control 294 controls the temperature of laser 264 in order to stabilize the output wavelength of laser 264. This wavelength stability is necessary to fix the value of the Verdet constant.

Figure 17:
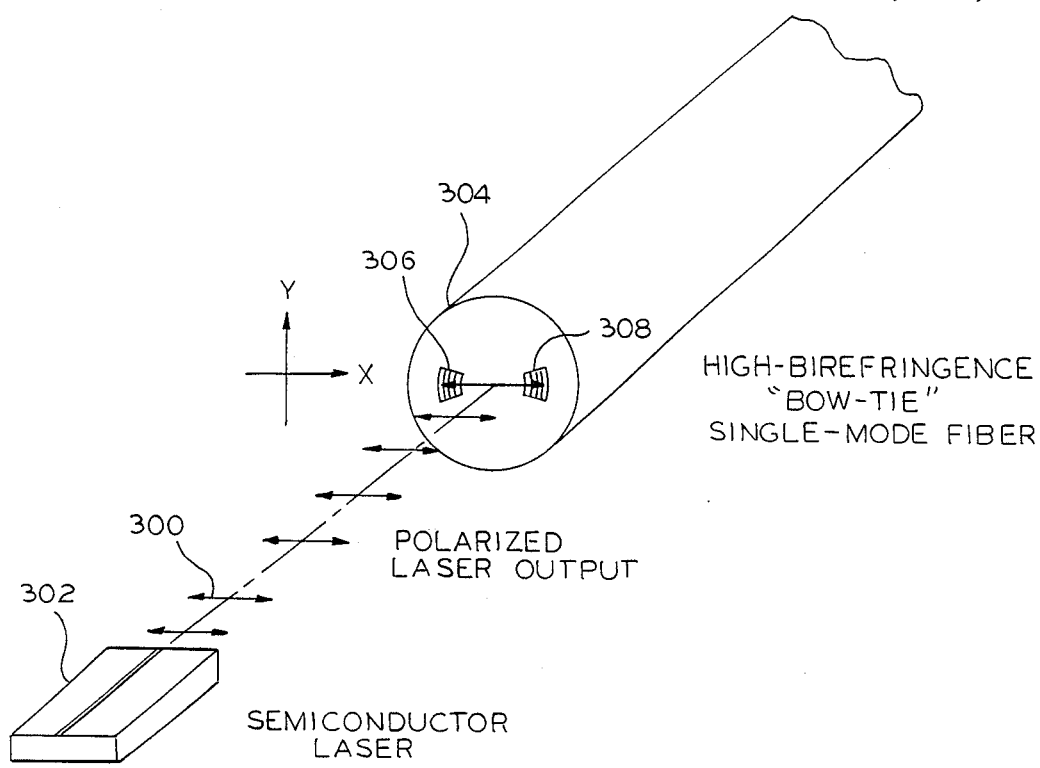
FIG. 17 is an example of a polarization preserving optical fiber.

FIG. 17 shows the construction of a typical high birefringence single mode optical fiber using the "bowtie" construction. Light having polarization direction 300 is emitted by semiconductor laser 302. The optical fiber 304 having a high birefringence is coupled to light having polarization direction 300 so that the polarization direction of the light substantially coincides with the stress direction of the fiber. The stress direction of the fiber is illustrated by layers 306, 308 formed within the high birefringence optical fiber 304. Optical fibers of the type illustrated by fiber 304 are useful as polarization holding single mode fiber 266, and as fiber polarizer 270.

Fiber loop sensing element 262 is made of a low birefringence material and is made to transmit only a single mode at the wavelength emitted by laser 264. Stresses developed in fiber loop sensing element 262 as a result of forming it into loops around power line 260 set up birefringence within the material. It has been found that a characteristic direction of fiber loop sensing element 262 lies in the plane parallel to the loops formed by the fiber. A second characteristic direction lies perpendicular to the plane of the loop. Characteristic direction 130, as shown in FIG. 2, for which angle 132 formed between characteristic direction 130 and the direction of the electric field of the linearly polarized light launched into fiber loop sensing element 262, may be either the characteristic direction parallel to the plane of the loops, or may be the characteristic direction perpendicular to the plane of the loops.

It is to be understood that the above described embodiments are simply illustrative of the principles of the invention. Various other modifications and changes may be made by those skilled in the art which will embody the principles of the invention and fall within the spirit and scope thereof.

What is claimed is:
1. A detector for electric current comprising:
   a material substantially transparent to light, said material having at least one characteristic direction in the absence of a magnetic field, and said material exhibiting the Faraday effect in response to a magnetic field generated by said electric current; and
   means for generating said light in a substantially linear polarization in a predetermined polarization direction and for injecting said light having a predetermined polarization direction into said material with an orientation with respect to said at least one characteristic direction such that a predetermined angle is established between said polarization direction and said at least one characteristic direction, said predetermined angle chosen to permit separation of a rotation of the polarization of said light by the Faraday effect from polarization effects on said light by a birefringence of said material.
2. A detector for electric current, comprising:
   a material substantially transparent to light, said material having at least one characteristic direction in the absence of a magnetic field, and said material exhibiting the Faraday effect in response to a magnetic field generated by said electric current; and
   means for generating said light in a substantially linear polarization in a predetermined polarization direction and for injecting said light having a predetermined polarization direction into said material with an orientation with respect to said at least one characteristic direction such that a non-zero angle is established between said polarization direction and said at least one characteristic direction, said non-zero angle chosen to permit separation of a rotation of the polarization of said light by the Faraday effect from other polarization effects on said light by said material.
3. The apparatus as in claim 2 further comprising:
   means for separating light emerging from said material into a first component having a first polarization and into a second component having a second polarization;
   means for detecting a first intensity of said first component and for detecting a second intensity of said second component; and,
   means, responsive to said first intensity and said second intensity, for determining a magnitude of said electric current.
4. The apparatus as in claim 1 or 2 further comprising:
   a first photodetector and a second photodetector to detect light after it emerges from said material, said first photodetector capable of detecting a first optical intensity having a first polarization direction at substantially 67.5 degrees to said at least one characteristic direction as said one characteristic direction appears at an exit surface of said material, and said second photodetector capable of detecting a second optical intensity having a second polarization direction at substantially 90 degrees to said first polarization direction.
5. The apparatus as in claim 1 or 2 further comprising:

means for separating light emerging from said material into a first component having a first polarization to form a first emerging light beam, and into a second component having a second polarization to form a second emerging light beam;

a first photodetector for detecting an intensity of said first emerging light beam;

means, responsive to said first photodetector, for computing a first ratio of an AC component to a DC component of said intensity of said first emerging light beam;

a second photodetector for detecting an intensity of said second emerging light beam;

means, responsive to said second photodetector, for computing a second ratio of an AC component to a DC component of said intensity of said second emerging light beam; and, means for computing a quotient by dividing a function of said first ratio by a function of said second ratio.

6. The apparatus as in claim 5 wherein said means for computing a quotient, further comprises:

means for producing a first average value of said first ratio;

means for producing a second average value of said second ratio; and, means for computing said quotient by dividing said first average value of said first ratio, by said second average value of said second ratio.

7. The apparatus as in claim 5 further comprising:

means for computing a stress birefringence of said material by using the expression $$\beta L = 2 * \sin^{-1}(K1 * (R-1)/(R+1))^{\frac{1}{2}}$$

wherein said R is a symbol standing for said quotient and said K1 is a numerical constant to account for polarization leakage in a polarizer; and, means, responsive to said first ratio and responsive to said birefringence $\beta L$, for computing said electric current.

8. The apparatus in claim 7 wherein said means for computing said electric current further comprises:

means, responsive to said birefringence $\beta L$, for computing a first correction factor $CF(1,\beta L)$, for said first ratio;

means for correcting said first ratio by said correction factor;

means, responsive to said first ratio and responsive to said first correction factor, for estimating a magnitude J, of said electric current;

means, responsive to said birefringence $\beta L$, for computing a spread function $SF(\beta L)$;

means for adjusting said correction factor using the expression $$ACF(J,\beta L) = CF(1,\beta L) - SF(\beta L) * (J/J_{max})^2$$

means for iterating a calculation of said quantity $ACF(J,\beta L)$ until a new value differs from the last value by less than a predetermined amount; and, means, responsive to said final value of said quantity $ACF(J,\beta L)$, for computing a final value of said electric current.

9. The apparatus as in claim 1, or 2 wherein said predetermined angle is between 10 degrees and 80 degrees.

10. The apparatus as in claim 1 or 2 wherein said predetermined angle is 22.5 degrees.

11. The apparatus as in claim 1 or 2 wherein said material transparent to said light comprises an optical fiber.

12. The apparatus as in claim 1 or 2 wherein said material substantially transparent to said light further comprises:

an optical fiber looped around a conductor carrying said electric current.

13. The apparatus as in claim 1 or 2 wherein said material transparent to said light comprises an optical fiber arranged in a coil, and a conductor carrying said electric current passes through said coil.

14. The apparatus as in claim 1 or 2 further comprising:

a magnetic field concentrator to concentrate said magnetic field onto said material substantially transparent to said light.

15. The apparatus as in claim 1 or 2 wherein said material transparent to said light comprises at least one block of glass.

16. The apparatus as in claim 1 or 2 wherein said material substantially transparent to said light, further comprises:

a block of glass having the shape of a rectangular parallelepiped.

17. The apparatus as in claim 1 or 2 further comprising:

wherein said material transparent to said light is a block of glass; and, a magnetic field concentrator surrounding a conductor carrying said electric current, said concentrator arranged to concentrate said magnetic field generated by said electric current onto said block of glass.

18. The apparatus as in claim 1 or 2 wherein said characteristic direction is parallel to a planar side of said block of glass.

19. The apparatus as in claim 1 or 2, wherein said means for generating light comprises a light emitting diode.

20. The apparatus as in claim 1 or 2, wherein said means for generating light comprises a laser.

21. The apparatus as in claim 1 or 2, wherein said means for generating light comprises a solid state laser.

22. The apparatus as in claim 1 or 2 wherein said means for generating said light having a predetermined polarization direction, further comprises:

an optical fiber having a light beam launched therein by said means for generating light; and, a polarizer having said light beam directed thereto by said optical fiber, said polarizer having a transmission direction, and said transmission direction set at substantially 22.5 degrees relative to said at least one characteristic direction.

23. An electric current detector, comprising:

a material substantially transparent to light, said material having at least one characteristic direction in the absence of a magnetic field, and said material exhibiting the Faraday effect in response to a magnetic field generated by said electric current;

means for generating said light in a substantially linear polarization in a predetermined polarization direction and for injecting said light having a predetermined polarization direction into said material with an orientation with respect to said at least one characteristic direction such that a predetermined angle is established between said polarization direction and said at least one characteristic direction, said predetermined angle chosen to permit separation of a rotation of the polarization of said light by the Faraday effect from polarization effects on said light by a birefringence of said material;

means for separating light emerging from said material into a first component having a first polarization and into a second component having a second polarization;

means for detecting a first intensity of said first component and for detecting a second intensity of said second component; and means, responsive to said first intensity and said second intensity, for determining a magnitude of said electric current.

24. An electric current detector, comprising:

a material substantially transparent to light, said material having at least one characteristic direction in the absence of a magnetic field, and said material exhibiting the Faraday effect in response to a magnetic field generated by said electric current;

means for generating said light in a substantially linear polarization in a predetermined polarization direction and for injecting said light having a predetermined polarization direction into said material with an orientation with respect to said at least one characteristic direction such that a predetermined angle of substantially 22.5 degrees is established between said polarization direction and said at least one characteristic direction;

means for separating light emerging from said material into a first component having a first polarization to form a first emerging light beam, and into a second component having a second polarization to form a second emerging light beam;

a first photodetector for detecting an intensity of said first emerging light beam;

means, responsive to said first photodetector, for computing a first ratio of an AC component to a DC component of said intensity of said first emerging light beam;

a second photodetector for detecting an intensity of said second emerging light beam;

means, responsive to said second photodetector, for computing a second ratio of an AC component to a DC component of said intensity of said second emerging light beam;

means for producing a first average value of said first ratio;

means for producing a second average value of said second ratio;

means for computing said quotient by dividing said first average value of said ratio, by said second average value of said second ratio;

means for computing a stress birefringence of said material by using the expression $$\beta L = 2 * \sin^{-1}(K1 * (R-1)/(R+1))^{\frac{1}{2}}$$

wherein said R is a symbol standing for said quotient and said K1 is a numerical constant to account for polarization leakage in a polarizer;

means, responsive to said birefringence $\beta L$, for computing a first correction factor $CF(1,\beta L)$, for said first ratio;

means for correcting said first ratio by said correction factor;

means, responsive to said first ratio and responsive to said first correction factor, for estimating a magnitude, J, of said electric current;

means, responsive to said birefringence $\beta L$, for computing a spread function $SF(\beta L)$;

means for adjusting said correction factor using the expression $$ACF(J,\beta L) = (CF(1,\beta L) - SF(\beta L)) * (J/J_{max})^2$$

means for iterating a calculation of said quantity $ACF(J,\beta L)$ until a new value differs from a last value by less than a predetermined amount; and, means, responsive to said past value of said quantity $ACF(J,\beta)$, for computing a final value of said electric current.

25. A method for detecting electric current comprising the steps of:

providing a material substantially transparent to light, said material having at least one characteristic direction in the absence of a magnetic field, and said material exhibiting the Faraday effect in response to a magnetic field generated by said electric current;

generating said light in a substantially linear polarization in a predetermined polarization direction;

choosing a predetermined angle to permit separation of a rotation of the polarization of said light by the Faraday effect from polarization effects on said light by a birefringence of said material; and injecting said light having a predetermined polarization direction into said material with an orientation with respect to said at least one characteristic direction to establish the predetermined angle between said polarization direction and said at least one characteristic direction.

26. A method for detecting electric current, comprising:

providing a material substantially transparent to light, said material having at least one characteristic direction in the absence of a magnetic field, and said material exhibiting the Faraday effect in response to a magnetic field generated by said electric current;

generating said light in a substantially linear polarization in a predetermined polarization direction;

choosing a non-zero angle to permit separation of a rotation of the polarization of said light by the Faraday effect from other polarization effects on said light by said material; and injecting said light having a predetermined polarization direction into said material with an orientation with respect to said at least one characteristic direction to establish the non-zero angle between said polarization direction and said at least one characteristic direction.

27. An electric current detector, comprising:

a material substantially transparent to light, said material having at least one characteristic direction in the absence of a magnetic field and said material exhibiting the Faraday effect in response to a magnetic field generated by said electric current;

means for generating said light in a substantially linear polarization in a predetermined polarization direction and for injecting said light having a predetermined polarization direction into said material with an orientation with respect to said at least one characteristic direction such that a predetermined angle of substantially 22.5 degrees is established between said polarization direction and said at least one characteristic direction; and a processor including:
  means for separating light emerging from said material into a first component and into a second component;
  means, responsive to said first component and said second component, for determining a stress birefringence of said material;
  means, responsive to said stress birefringence, for producing a correction factor; and
  means, responsive to said correction factor for determining a magnitude of said electric current.

28. A method for detecting electric current, comprising the steps of:
  providing a material substantially transparent to light, said material having at least one characteristic direction in the absence of a magnetic field, and said material exhibiting the Faraday effect in response to a magnetic field generated by said electric current;
  generating said light in a substantially linear polarization in a predetermined polarization direction;
  choosing a non-zero angle to permit separation of a rotation of the polarization of said light by the Faraday effect from other polarization effects on said light by said material; and
  injecting said light having a predetermined polarization direction into said material with an orientation with respect to said at least one characteristic direction to establish the non-zero angle between said polarization direction and said at least one characteristic direction;
  separating light emerging from said material into a first component having first polarization to form a first emerging light beam, and into a second component having a second polarization to form a second emerging light beam;
  in response to said first component and said second component, determining a stress birefringence of said material;
  in response to said stress birefringence, producing a correction factor; and
  in response to said correction factor, determining the value of said electric current.

29. The method as in claim 28 wherein said chosen non-zero angle is substantially 22.5 degrees.

* * * * *